United States Patent
Chang et al.

(10) Patent No.: US 8,440,320 B2
(45) Date of Patent: *May 14, 2013

(54) ARTICLE

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Shyan-Juh Liu, Tu-Cheng (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 56 days.

This patent is subject to a terminal disclaimer.

(21) Appl. No.: 13/083,694

(22) Filed: Apr. 11, 2011

(65) Prior Publication Data
US 2012/0171513 A1 Jul. 5, 2012

(30) Foreign Application Priority Data
Dec. 29, 2010 (CN) .......................... 2010 1 0612825

(51) Int. Cl.
*B32B 15/04* (2006.01)
*B32B 15/14* (2006.01)
*B32B 18/00* (2006.01)

(52) U.S. Cl.
USPC ........... 428/634; 428/627; 428/666; 428/668; 428/332; 428/610; 428/215

(58) Field of Classification Search ................... 428/634, 428/627, 666, 668, 336, 332, 610, 215, 216, 428/220
See application file for complete search history.

(56) References Cited

U.S. PATENT DOCUMENTS
6,299,438 B1 * 10/2001 Sahagian et al. .................. 433/6
2012/0171508 A1 * 7/2012 Chang et al. .................. 428/610

* cited by examiner

*Primary Examiner* — Michael La Villa
(74) *Attorney, Agent, or Firm* — Altis Law Group, Inc.

(57) ABSTRACT

An article includes a substrate made of carbon fiber and zirconium diboride composites; an chromium layer deposited on the substrate; an chromium diffusing layer formed between the substrate and the chromium layer; and a iridium layer deposited on the chromium layer opposite to the chromium diffusing layer.

6 Claims, 2 Drawing Sheets

ARTICLE

BACKGROUND

1. Technical Field

The exemplary disclosure generally relates to articles and method for manufacturing the articles.

2. Description of Related Art

Carbon fiber has a low thermo expansion coefficient, low density and good corrosion resistance so it is widely used in many fields, such as the aerospace and automotive industries. Nowadays, composites made up of carbon fiber and zirconium diboride (ZrB2) composites are used as well, in many fields. However, carbon fiber and zirconium diboride (ZrB2) composites have a low temperature oxidation resistance. Niobium alloy has a good oxidation resistance in high temperature. However, niobium alloy has a low wettability to polymer, which limits the application in the above fields.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary article and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
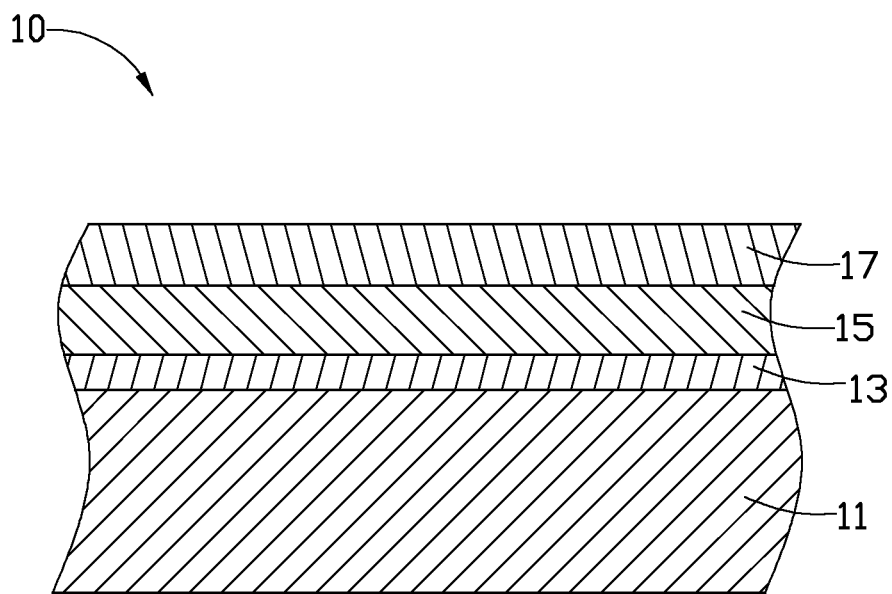
FIG. 1 is a cross-sectional view of an exemplary embodiment of an article.

Referring to FIG. 1, an exemplary embodiment of an article 10 includes a substrate 11, a chromium layer 15 deposited on the substrate 11, a chromium diffusing layer 13 formed between the substrate 11 and the chromium layer 15, and an iridium layer 17 deposited on the chromium layer 15 opposite to the chromium diffusing layer 13. The substrate 11 may be made of carbon fiber and zirconium diboride (ZrB2) composites. The chromium diffusing layer 13 has a thickness between 2 micrometers and 3.5 micrometers. The iridium layer 17 has a thickness between 2 micrometers and 3.5 micrometers. The chromium layer 15 and the iridium layer 17 may both be deposited by magnetron sputtering process. The chromium diffusing layer 13 is formed between the chromium layer 15 and the substrate 11 in such a way that atomic chromium in the chromium layer 15 diffuses toward the substrate 11 during deposition of the chromium layer 15 on the substrate 11. The chromium diffusing layer 13 comprises carbon-fiber phasephaseZirconium-diboride ceramic phase, chromium metal phase and chromium-carbon phase.

Figure 2:
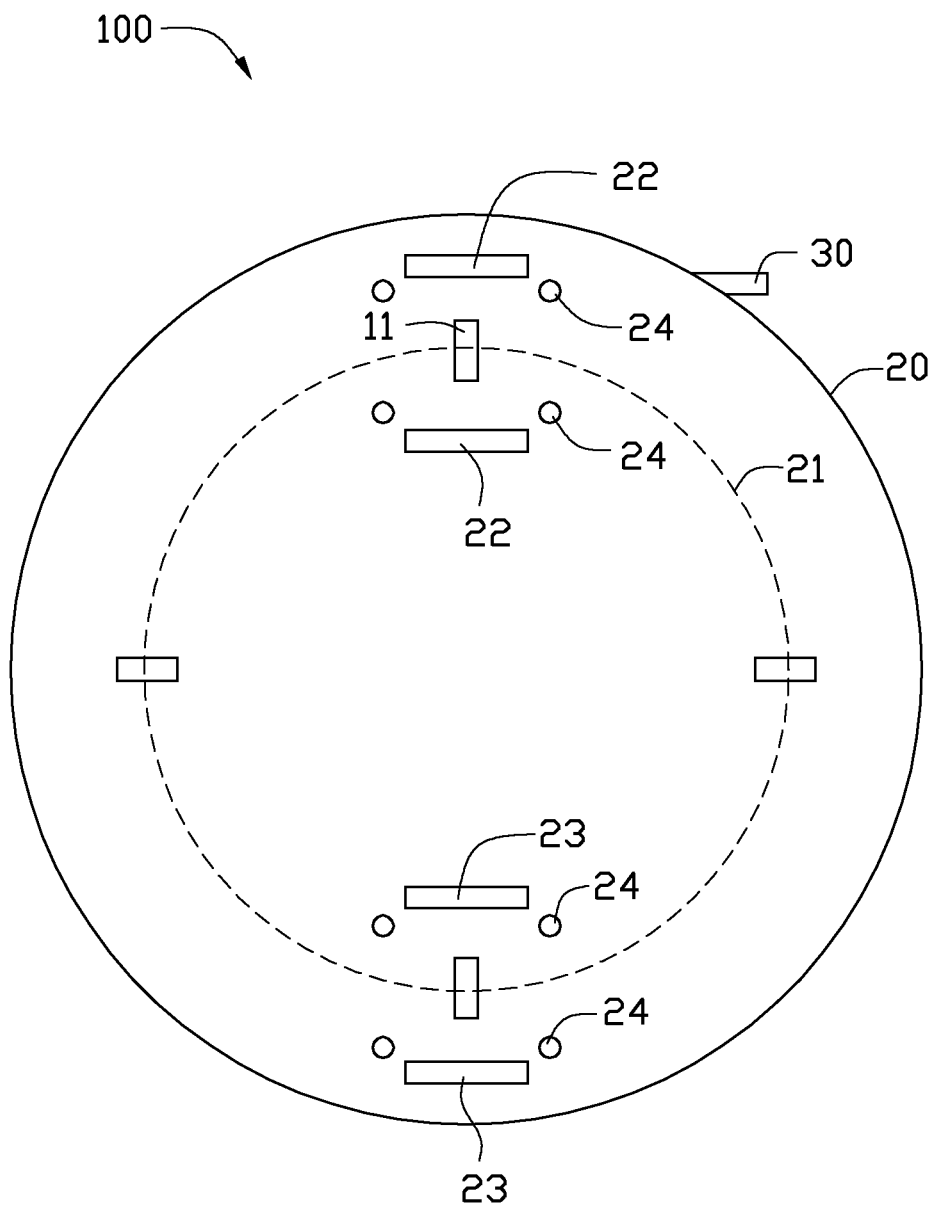
FIG. 2 is a schematic view of a magnetron sputtering coating machine for manufacturing the article in FIG. 1.

Referring to FIG. 2, a method for manufacturing the article 10 may include at least the following steps.

Providing a substrate 11. The substrate 11 may be made of carbon fiber and Zirconium diboride (ZrB2) composites.

Providing a vacuum sputtering coating machine 100. The vacuum sputtering coating machine 100 includes a sputtering coating chamber 20 and a vacuum pump 30 connecting to the sputtering coating chamber 20. The vacuum pump 30 is used to pump the air out the sputtering coating chamber 20. The vacuum sputtering coating machine 100 further includes a rotating bracket 21, two first targets 22, two second targets 23 and a plurality of gas inlets 24. The rotating bracket 21 rotates the substrate 11 in the sputtering coating chamber 20 relative to the first targets 22 and the second targets 23. The first targets 22 face each other, and are respectively located on one side of the rotating bracket 21. The second targets 23 face each other, and are respectively located on opposite sides of the rotating bracket 21. In this exemplary embodiment, the first targets 22 are chromium targets, the second targets 23 are iridium targets.

The substrate 11 is then positioned in the vacuum sputtering coating machine 100 for argon plasma cleaning. The vacuum level inside the sputtering coating chamber 20 is adjusted to about 8.0×10−3 Pa. Pure argon is fed into the sputtering coating chamber 20 at a flux between about 300 Standard Cubic Centimeters per Minute (sccm) and about 500 sccm from the gas inlets 24. A bias voltage applied to the substrate 11 is between about −500 volts to about −800 volts for between about 5 minutes and about 15 minutes. Therefore, the substrate 11 is washed by argon plasma, to remove the grease and dirt so the binding force between the substrate 11 and the chromium layer 15 is enhanced.

An chromium layer 15 is deposited on the substrate 11. The temperature in the sputtering coating chamber 20 is set between about 100° C. (Celsius degree) and about 200° C. Argon is fed into the sputtering coating chamber 20 at a flux between about 20 sccm and 150 sccm from the gas inlets 24. The first targets 22 in the sputtering coating chamber 20 are evaporated at a power between about 2 kW and about 5 kW. A bias voltage applied to the substrate 11 may be between about −100 volts and about −300 volts, for between about 150 minutes and about 250 minutes, to deposit the chromium layer 15 on the substrate 11. During depositing the chromium layer 15, atomic chromium in the chromium layer 15 diffuses toward the substrate 11 to form a chromium diffusing layer 13 comprising carbon-fiber phase, Zirconium-diboride ceramic phase, chromium metal phase and chromium-carbon phase. The chromium diffusing layer 13 enhances the binding force between the substrate 11 and the chromium layer 15.

An iridium layer 17 is deposited on the chromium layer 15. The temperature in the sputtering coating chamber 20 is set between about 100° C. and about 200° C. Pure Argon is fed into the sputtering coating chamber 20 at a flux between about 20 sccm and 150 sccm from the gas inlets 24. The second targets 23 in the sputtering coating chamber 20 are evaporated at a power between about 2 kW and about 5 kW. A bias voltage applied to the substrate 11 may be between about −100 volts and about −300 volts, for between about 150 minutes and about 250 minutes, to deposit the iridium layer 17 on the chromium layer 15.

The iridium layer 17 has a good compactness, which can prevent environmental oxygen from diffusing in the iridium layer 17. Thus, the iridium layer 17 can cause the article 10 to have high temperature oxidation resistance. Additionally, during depositing the iridium layer 17, atomic iridium in the iridium layer 17 can diffuse toward the chromium layer 15 so there is a smooth transition between the iridium layer 17 and the chromium layer 15, to enhance the binding force between the iridium layer 17 and the chromium layer 15. Furthermore, atomic chromium in the chromium layer 15 diffuses toward the substrate 11 to form a chromium diffusing layer 13 enhancing the binding force between the substrate 11 and the chromium layer 15. So the substrate 11, the chromium layer 15 and the iridium layer 17 can be bound together well, and the iridium layer 17 can not be easily peeled off the substrate 11. Thus, the article 10 has a good shock resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
a substrate made of carbon fiber-zirconium diboride composite;
a chromium layer deposited on the substrate;
a chromium diffusing layer formed between the substrate and the chromium layer; and
an iridium layer deposited on the chromium layer opposite to the chromium diffusing layer.

2. The article as claimed in claim 1, wherein the chromium diffusing layer has a thickness between 2 micrometers and 3.5 micrometers.

3. The article as claimed in claim 1, wherein the iridium layer has a thickness between 2 micrometers and 3.5 micrometers.

4. The article as claimed in claim 1, wherein the chromium layer and the iridium layer are both deposited by magnetron sputtering process.

5. The article as claimed in claim 1, wherein the chromium diffusing layer is formed between the chromium layer and the substrate by atomic chromium in the chromium layer diffusing toward the substrate during deposition of the chromium layer on the substrate.

6. The article as claimed in claim 1, wherein the chromium diffusing layer comprises carbon-fiber phase, zirconium-diboride ceramic phase, chromium metal phase and chromium-carbon phase.

\* \* \* \* \*